United States Patent
Colombo

[19]

[11] Patent Number: 5,905,614
[45] Date of Patent: May 18, 1999

[54] DEVICE FOR PROTECTION AGAINST ELECTROSTATIC DISCHARGES ON THE TERMINALS OF A MOS INTEGRATED CIRCUIT

[75] Inventor: Paolo Colombo, Tradate, Italy

[73] Assignee: STMicroelectronics S.r.l., Agrate Brianza, Italy

[21] Appl. No.: 08/979,273

[22] Filed: Nov. 26, 1997

[30] Foreign Application Priority Data

Nov. 29, 1996 [EP] European Pat. Off. ............... 96830602

[51] Int. Cl.$^6$ ....................................................... H02H 9/00
[52] U.S. Cl. ............................... 361/56; 361/111; 361/118
[58] Field of Search .................................. 361/56, 58, 91, 361/111, 113, 115, 118, 119, 127

[56] References Cited

U.S. PATENT DOCUMENTS 5,311,391  5/1994  Dungan et al. ........................... 361/56
5,452,171  9/1995  Metz et al. ............................... 361/56
5,550,699  8/1996  Diaz ......................................... 361/56

*Primary Examiner*—Jeffrey Gaffin
*Assistant Examiner*—Stephen W. Jackson
*Attorney, Agent, or Firm*—David V. Carlson; Seed & Berry LLP

[57] ABSTRACT

A device for protection against electrostatic discharges on the terminals of a MOS integrated circuit and characterized in that it consists of a first and a second circuit branch coupled between the terminal to be protected and ground. The first circuit branch has two field transistors. The gate of the first field-effect transistor is connected to terminal to be protected, and the gate of the second field-effect transistor is connected to a first resistance of the second circuit branch. The second circuit branch has a third field-effect transistor with its gate terminal connected to ground and a second resistance inserted between the third transistor and the terminal to be protected.

12 Claims, 2 Drawing Sheets

DEVICE FOR PROTECTION AGAINST ELECTROSTATIC DISCHARGES ON THE TERMINALS OF A MOS INTEGRATED CIRCUIT

TECHNICAL FIELD

The present invention relates to a MOS integrated circuit and specifically to a device for protecting against electrostatic discharges on the I/O (input and output) terminals of the integrated circuits or on the terminals for powering them and which could be the one for programming in the case of non-volatile memory cells.

BACKGROUND OF THE INVENTION

The terminals of an integrated circuit may be subject to accidental contact with electrically charged bodies during manufacture and assembly in a circuit complex or during operation such that potential differences of a very significant magnitude may be created. For example, a significant potential difference may be created between the gate electrodes of the input transistors, or between the drain regions of the output transistors and the substrate of semiconductor material on which the integrated circuit is formed. In the first case, if the potential differential exceeds the dielectric rigidity threshold of the gate insulation the transistor is put out of service by the electrostatic discharge that develops through the insulation. In the second case, a similar destructive effect occurs as soon as the potential difference exceeds the inverse breakdown threshold of the drain junction. By way of example, in a CMOS integrated circuit manufactured with 1.2 $\mu$m technology the breakdown voltage for the input transistors is approximately 12 V to 14 V and that of the output transistors is approximately 12 V.

Various remedies are known for protecting the different input, output, and power supply terminals from electrostatic discharges. Some of them use resistors in series and diodes in series and/or in parallel and are integrated in the substrate on which the integrated circuit is formed to limit or shunt the currents resulting from the electrostatic discharges, thus lending themselves essentially to the protection of input terminals. Other remedies include use of structures of the thyristor discharge or Silicon Controlled Rectifier (SCR) type in parallel and can be used for the protection of both input and output terminals.

In many cases, protection devices using lateral bipolar transistors have also been used effectively.

A known protection device particularly suited for monolithic integration in a MOS integrated circuit to be protected is described in Italian patent application no. 26063 A/80 filed by this applicant. The protection device consists essentially of an NPN lateral transistor having an emitter and collector doped with N-type impurities simultaneously with, and identically to the source and drain regions of the IGFET of the MOS circuit to be protected, and an inaccessible base doped heavily and deeply with P-type impurities by ion implantation.

In Italian patent application no. 23077A/85 of this applicant, a perfected use of the same structure is described. The perfected protection device consists of a first and a second lateral bipolar transistor having their collector terminals connected respectively to the input terminal of the circuit and to the gate electrodes of the IGFET. The first and second bipolar transistors have their emitter terminals connected to a ground terminal and a diffuse resistor (R') connecting the collectors of the two lateral transistors.

The width of the base of the first transistor and the concentration of impurities in the bases of both transistors keep the ignition voltage of the negative resistance phenomena of the first lateral transistor, and the breakdown voltage of the second lateral transistor, at a value lower than the breakdown voltage of the gate insulating oxides and the breakdown voltage of the bipolar junctions included in the integrated circuit. The width of the base and the concentrations of the bases further keep the sustaining voltage of the first lateral transistor at a value higher than the supply voltage of the integrated circuit.

We shall now discuss specifically the protection requirement for the Vpp voltage supply terminals for non-volatile memory cell programming. As shown in FIG. 1, the ideal protection characteristic of a protection device for this type of voltage supply terminal should ignite by snap back at a voltage less than the breakdown voltage of the cell gate oxides, be able to sustain on voltages higher than the maximum rating of the supply terminal (13.2 V is typical for Vpp), and ensure static functionality following voltage spikes.

The methods of protection using lateral bipolar transistors usually implemented for the input/output terminals do not entirely satisfy the Vpp dedicated functionality requirements. For example, an 18 V trigger voltage is acceptable, but a 9 V sustaining voltage implies that in the case of ignition for a spike on Vpp the bipolar protection transistor would remain on because it is being fed by this power supply.

By applying special contrivances to the collector junction and using special process systems it is possible to obtain lateral bipolar transistors having acceptable clamp values and lateral bipolars with less doped collector scattering (n-) that typically display Vtrig=21-23 V and Vsu=14 V.

However, these solutions nevertheless have the following three shortcomings:
- the protection structures are dependent on the particular device manufacturing process;
- the lateral bipolar transistors display deterioration after ESD because of charge being trapped in the "beak" of the oxide overlying the base region (soft leakage); and
- the trigger voltage is higher than the breakdown voltage of the n+junction towards the insulation system with less difference with respect to the Vbkdox voltage and the breakdown voltage of the gate insulating oxides.

Another bipolar solution with resistive divider displays the shortcoming of introducing a resistance in the path between the terminal pad and internal circuitry. Therefore, during memory cell programming it is possible that the necessary Vpp fraction on the cell gate is not available.

SUMMARY OF THE INVENTION

According to the principles of the present invention, a protection device is provided for protecting against electrostatic discharges (ESD) on the terminals of a MOS integrated circuit. The protection device is particularly effective for protecting the cell programming power supply terminals of integrated circuits having non-volatile memory cells.

The characteristics and advantages of the protection device according to embodiments of the present invention are set forth in the descriptions given below by way of non-limiting example with reference to the drawings.

DETAILED DESCRIPTION OF THE INVENTION

Figure 2:
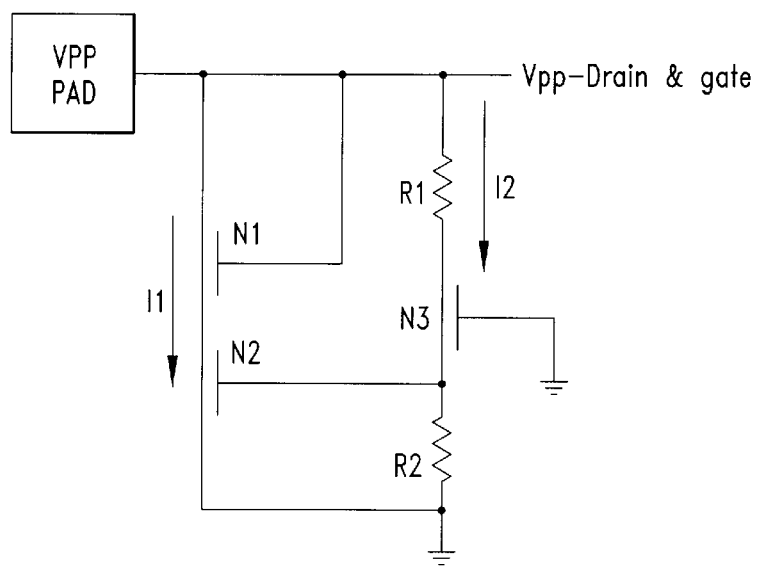
FIGS. 2 and 3 show circuit diagrams of protection devices in accordance with embodiments of the present invention.
Figure 3:
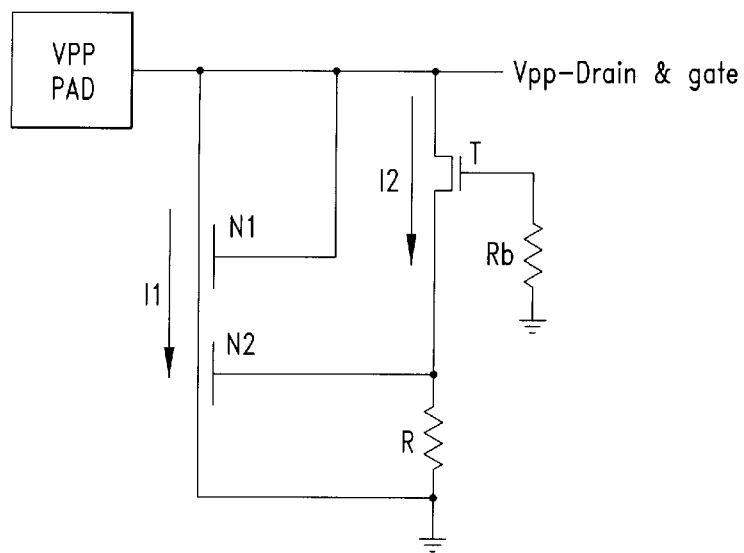

FIGS. 2 and 3 show the circuit structures of a device for protecting against electrostatic discharges according to embodiments of the present invention. The embodiments of the device consist of a main branch having two field-effect transistors in cascode configuration through which the electrostatic energy is dissipated, and an ignition branch that can be implemented in different ways to optimize the operating mode of the protection circuit.

The following observations are made essentially for the purpose of optimizing a specific protection mechanism for electrostatic discharges on a voltage supply terminal Vpp (pad) for non-volatile memory cell programming in a MOS integrated circuit. However, a protection device according to the embodiments of the present invention can also be used effectively in other usual applications for integrated circuit input and output terminals.

In FIGS. 2 and 3, transistor N1 is diode-connected while the gate terminal of transistor N2 is connected to ground through a resistor of the ignition branch R2 as shown FIG. 2, or R, as shown in FIG. 3. The field-effect transistors N1 and N2 are of the NMOS type in the basic structure of the protection device.

Figure 1:
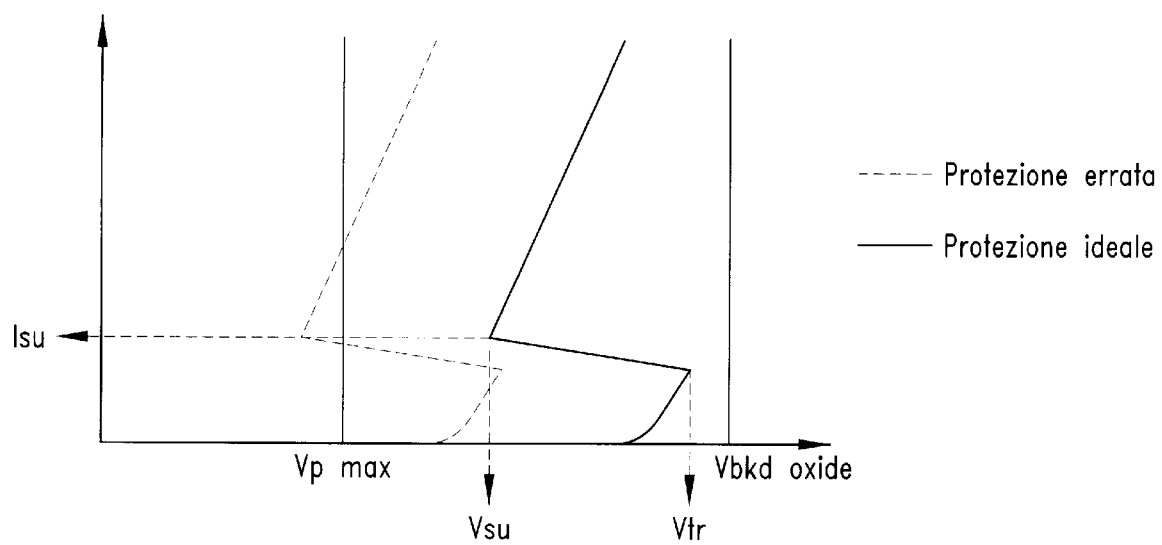
FIG. 1 shows graphically the manner of operation of a protection device that is effective against electrostatic discharges.
Figure 4:
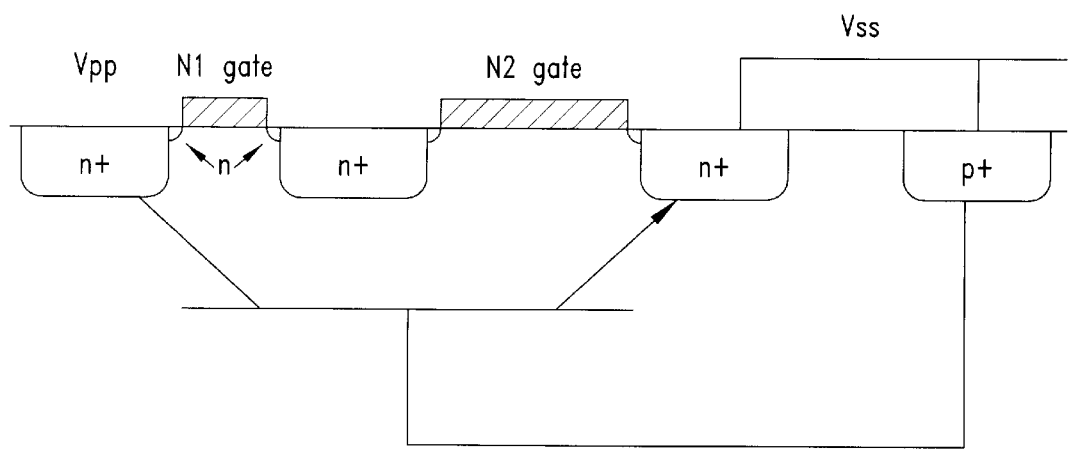
FIG. 4 shows a cross section of a monolithically integrated structure which is a possible implementation of the basic part of a protection device in accordance with embodiments of the present invention.

The first transistor N1 is diode connected and should be topologically short to reduce the series resistance in the branch. The diode connection makes the gate oxide of transistor N1 immune to stress. The second transistor N2 is driven by the ignition branch. Functionality is ensured by the fact that the integrated structure parasitic bipolar transistor of the main branch is topologically very long, as shown in FIG. 4, and carries voltages for ideal $V_{pp}$ protection as shown in FIG. 1.

The basic structure of the ignition branch for an embodiment of the present invention consists of a resistor R1 of approximately 100 Ohms diffused in n+region and a resistor R2 of approximately 1000 Ohms formed in an n-well. The resistor R1 protects the gate oxide of a NMOS transistor (N3) whose gate is tied to ground. Ignition takes place upon the formation of the parasitic bipolar transistor of N3 and the parasitic transistor current causes a voltage drop across resistance R2. Since it is important to reduce the ignition time of the parasitic transistor, N3 may be designed as a short MOS transistor.

Functionality is ensured by the highly resistive path of the ignition branch. The total resistance of the branch is evaluated in a manner such that the current I2 is less than the Isu. Assuming that a voltage spike causes snap-back of the transistor N3, the voltage at the ends of N3 is at the worst 8V following the voltage spike. The total resistance of the branch is evaluated in such a manner that the current I2 is less than the current Isu. Therefore, the current I2 is given by the following formula:

$$\frac{Vpp - 8[V]}{R1 + R2 + R(N3)} \leq Isu$$

where R(N3) represents the dynamic resistance of the parasitic bipolar transistor of N3, and Vpp is the programming voltage.

The main advantages of the circuit structure shown in FIG. 2 are the following:

the trigger voltage of the structure is limited to breakdown voltages of conventional gated junctions and is thus less than that of a standard bipolar transistor;

no resistive path is necessary between the pad and the memory cell programming circuitry;

the unprotected gated MOS structure in the pilot branch that is notoriously critical for ESD has been avoided;

there are no problems linked to charge trapping in the field oxide;

the circuit structure is independent of the process so that no additional costs are required; and the integration surface area occupied by the circuit structure can be minimized by arranging the basic structure on two branches, thus occupying a surface area less than the typical ESD protection circuit with divider.

FIG. 3 shows another embodiment of the present invention. The basic structure of the ignition branch consists of a topologically short bipolar transistor followed by an n-well resistance R of approximately 1000 Ohms. Ignition takes place when the breakdown current of the bipolar transistor causes a voltage drop on the resistance R. Since it is important to reduce the ignition time of the bipolar transistor, it is appropriate to make it with a narrow base.

Functionality is ensured by the highly resistive path of the ignition branch. The total resistance of the branch is evaluated in a manner such that the current I2 is less than the Isu. The current I2 is given by the following formula:

$$\frac{Vpp - 8[V]}{R + R(bip)} \leq Isu$$

where R(bip) represents the dynamic resistance of the lateral bipolar transistor T, and Vpp is the programming voltage.

The embodiment shown in FIG. 3 does not require protecting the gate oxide of a MOS transistor, as does the embodiment shown in FIG. 2. As a result, the embodiment shown in FIG. 3 has better intrinsic strength and occupies less integration surface area. However, using a bipolar transistor in the ignition branch may result in soft-leakage problems, and also ignition delay problems because the trigger voltage is higher with the bipolar transistor than the gated junction used in the embodiment shown in FIG. 2.

Modifications or substitutions to the embodiments described above can be made in a manner known to one of ordinary skill in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A device for protection against electrostatic discharges on the terminals of a MOS integrated circuit comprising a first and a second circuit branch between a terminal to be protected and ground with the first circuit branch comprising a first and a second field-effect transistor and having respective gate terminals connected respectively to the terminal and to a first end of a first resistance included in the second circuit branch and having a second end connected to ground, the second branch further comprising a snap-back device coupled between the terminal to be protected and the first end of the first resistance.

2. The device for protection against electrostatic discharges in accordance with claim 1 wherein the snap-back device comprises a third field-effect transistor having its gate terminal connected to ground and a second resistance inserted between the third field-effect transistor and the terminal to be protected.

3. The device for protection against electrostatic discharges in accordance with claim 1 wherein the snap-back device comprises a bipolar transistor inserted between the first resistance and the terminal to be protected and having a base terminal connected to ground through a base resistance.

4. The device for protection against electrostatic discharges in accordance with claim 3 wherein topologically the bipolar transistor integrated in the device is short and has a narrow base region.

5. The device for protection against electrostatic discharges in accordance with claim 1 wherein the first and the second field-effect transistors are connected together in accordance with a cascode configuration.

6. The device for protection against electrostatic discharges in accordance with claim 5 wherein the first and the second field-effect transistors are NMOS type.

7. An ESD protection circuit for a MOS integrated circuit having a plurality of signal terminals and a ground terminal, the ESD protection circuit comprising:
   a main branch having a first field-effect transistor and a second field-effect transistor, the main branch coupled between one of the plurality of signal terminals and the ground terminal and being structured to provide a conductive path for a discharge pulse;
   an ignition branch having a first resistive element, a second resistive element, and a transistor, the ignition branch coupled between the one of the plurality of signal terminals and the ground terminal, the ignition branch being structured to trigger the main branch to provide the conductive path upon receiving an ESD pulse;
   the first field-effect transistor of the main branch having a source, a drain, and a gate, wherein the drain and the gate are coupled to the one of the plurality of signal terminals; and
   the second field-effect transistor of the main branch having a source coupled to the ground terminal, a drain coupled to the source of the first field-effect transistor of the main branch, and a gate coupled to ground through the second resistive element of the ignition branch.

8. The ESD protection circuit according to claim 7 wherein the transistor of the ignition branch is a field-effect transistor having a source coupled to the ground terminal through the second resistive element of the ignition branch, a drain coupled to the one of the plurality of signal terminals through the first resistive element of the ignition branch, and a gate coupled to the ground terminal.

9. The ESD protection circuit according to claim 7 wherein the one of the plurality of signal terminals is a voltage supply terminal.

10. The ESD protection circuit according to claim 7 wherein the transistor of the ignition branch is a bipolar junction transistor having a first terminal coupled to the ground terminal through the second resistive element of the ignition branch, a second terminal coupled to the one of the plurality of signal terminals, and a base terminal coupled to the ground terminal through the first resistive element of the ignition branch.

11. The ESD protection circuit according to claim 10 wherein the first resistive element of the ignition branch is a series base resistance.

12. An MOS integrated circuit having a plurality of signal terminals and a ground terminal, and an ESD protection circuit, the ESD protection circuit comprising:
   a main branch having a first field-effect transistor and a second field-effect transistor, the main branch coupled between one of the plurality of signal terminals and the ground terminal and being structured to provide a conductive path for a discharge pulse;
   an ignition branch having a first resistive element, a second resistive element, and a transistor, the ignition branch coupled between the one of the plurality of signal terminals and the ground terminal, the ignition branch being structured to trigger the main branch to provide the conductive path upon receiving an ESD pulse;
   the first field-effect transistor of the main branch having a source, a drain, and a gate, wherein the drain and the gate are coupled to the one of the plurality of signal terminals; and
   the second field-effect transistor of the main branch having a source coupled to the ground terminal, a drain coupled to the source of the first field-effect transistor of the main branch, and a gate coupled to ground through the second resistive element of the ignition branch.

* * * * *